United States Patent [19]

Baliga

[11] Patent Number: 5,241,194
[45] Date of Patent: Aug. 31, 1993

[54] BASE RESISTANCE CONTROLLED THYRISTOR WITH INTEGRATED SINGLE-POLARITY GATE CONTROL

[75] Inventor: Bantval J. Baliga, Raleigh, N.C.

[73] Assignee: North Carolina State University at Raleigh, Raleigh, N.C.

[21] Appl. No.: 990,659

[22] Filed: Dec. 14, 1992

[51] Int. Cl.[5] .................... H01L 29/74; H01L 29/02; H01L 29/72

[52] U.S. Cl. .................... 257/133; 257/146; 257/154; 257/155; 257/163; 257/173; 257/370; 257/566; 257/577

[58] Field of Search ............... 257/107, 133, 134, 135, 257/136, 146, 154, 155, 163, 173, 175, 378, 369, 370, 392, 402, 566, 574, 577

[56] References Cited

U.S. PATENT DOCUMENTS

| | | |
|---|---|---|
| 4,760,431 | 7/1988 | Nakagawa et al. ............ 357/23.4 |
| 4,914,496 | 4/1990 | Nakagawa et al. ............ 357/38 |
| 4,928,155 | 5/1990 | Nakagawa et al. ............ 357/23.4 |
| 4,954,869 | 9/1990 | Bauer ........................ 357/38 |
| 4,956,690 | 9/1990 | Kato ......................... 357/38 |
| 4,959,703 | 9/1990 | Ogura et al. ................ 357/38 |
| 4,963,972 | 10/1990 | Shinobe et al. ............. 357/38 |
| 4,985,738 | 1/1991 | Nishizawa et al. ........... 257/136 |
| 5,014,102 | 5/1991 | Adler ........................ 357/38 |
| 5,086,323 | 2/1992 | Nakagawa et al. ............ 357/23.4 |
| 5,089,864 | 2/1992 | Sakurai ..................... 357/23.4 |

(List continued on next page.)

OTHER PUBLICATIONS

Baliga, Adler, Gray and Love, "The Insulated Gate Rectifier (IGR): A New Power Switching Device," IEEE, IEDM-82, pp. 264-267, 1982.
Temple, "MOS Controlled Thyristors (MCT'S)", IEDM-84, pp. 282-285, 1984.
Baliga, Adler, Love, Gray and Zommer, "The Insulated Gate Transistor: A New Three-Terminal MOS-Controlled Bipolar Power Device", IEEE Transactions on Electron Devices, vol. ED-31, No. 6, pp. 821-828, Jun., 1984.
Baliga and Chang, "The MOS Depletion-Mode Thyristor: A New MOS-Controlled Bipolar Power Device", IEEE Electron Device Letters, vol. 8, No. 8, pp. 411-413, Aug., 1988.
Baliga, "The MOS-Gated Emitter Switched Thyristor", IEEE Electron Device Letters (reprint), vol. 11, No. 22, pp. 75-77, Feb., 1990.
Nandakumar, Baliga, Shekar, Tandon and Reisman, "A New MOS-Gated Power Thyristor Structure with Turn-Off Achieved by Controlling the Base Resistance," IEEE Electron Letters, vol. 12, No. 5, pp. 227-229, May, 1991.

(List continued on next page.)

Primary Examiner—Ngan Ngo
Attorney, Agent, or Firm—Bell, Seltzer, Park & Gibson

[57] ABSTRACT

A base resistance controlled thyristor with integrated single-polarity gate control includes a thyristor having an anode region, a first base region, a second base region on the first base region and a cathode region contacting the second base region and defining a P-N junction therewith. For providing gated turn-off control, a depletion-mode field effect transistor is provided on the second base region and is separated therefrom by an insulating region. In particular, an insulating region, such as a buried dielectric layer, is provided on the second base region and the depletion-mode field effect transistor is formed thereon. The depletion-mode field effect transistor is electrically connected between the cathode contact and the second base region and provides a direct electrical connection therebetween in response to a turn-off bias signal which is preferably a zero or near zero bias. The insulating region, on the other hand, prevents direct electrical conduction between the second base region and the source of the depletion-mode transistor. The insulating region can be formed as a buried dielectric layer during processing and is preferably selected from the group consisting of $SiO_2$, $Si_3N_4$, $Al_2O_3$ and $MgAl_2O_4$.

19 Claims, 6 Drawing Sheets

U.S. PATENT DOCUMENTS

| | | | |
|---|---|---|---|
| 5,091,766 | 2/1992 | Terashima | 357/38 |
| 5,093,701 | 3/1992 | Nakagawa et al. | 357/23.4 |
| 5,099,300 | 3/1992 | Baliga | 357/37 |
| 5,105,244 | 4/1992 | Bauer | 357/23.4 |
| 5,144,401 | 9/1992 | Ogura et al. | 357/38 |

OTHER PUBLICATIONS

Shekar, Baliga, Nandakumar, Tandon and Reisman, "Characteristics of the Emitter-Switched Thyristor", IEEE Transactions on Electron Devices, vol. 38, No. 7, pp. 1619–1623, Jul., 1991.

Nandakumar, Baliga, Shekar, Tandon and Reisman, "The Base Resistance Controlled Thyristor (BRT) 'A New MOS Gated Power Thyristor'", IEEE, pp. 138–141, 1991.

Shekar, Baliga, Nandakumar, Tandon and Reisman, "Experimental Demonstration of the Emitter Switched Thyristor", pp. 128–131.

BASE RESISTANCE CONTROLLED THYRISTOR WITH INTEGRATED SINGLE-POLARITY GATE CONTROL

CROSS REFERENCE TO RELATED APPLICATIONS

This application is related to application Ser. No. 07/990,062, entitled INSULATED GATE BIPOLAR TRANSISTOR WITH REDUCED SUSCEPTIBILITY TO PARASITIC LATCH-UP; and application Ser. No. 07/990,290, entitled EMITTER SWITCHED THYRISTOR WITH BURIED DIELECTRIC LAYER; both filed concurrently herewith.

FIELD OF THE INVENTION

The present invention relates to semiconductor switching devices, and more particularly to thyristors with MOS-gated control.

BACKGROUND OF THE INVENTION

The development of semiconductor switching technology for high power applications in motor drive circuits, appliance controls, robotics and lighting ballasts, for example, began with the bipolar junction transistor. As the technology matured, bipolar devices became capable of handling large current densities in the range of 40-50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under an appropriate gate bias. The gate electrode is separated from the device's channel by an intervening insulator, typically silicon dioxide. Because the gate is insulated from the channel, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry can be easily implemented on a single chip. As compared to bipolar technology, the simple gate control provides for a large reduction in cost and a significant improvement in reliability.

These benefits are offset, however, by the relatively high on-resistance of the MOSFET's channel, which arises from the absence of minority carrier transport. As a result, the device's operating forward current density is limited to relatively low values, typically in the range of 10 A/cm$^2$, for a 600 V device, as compared to 40-50 A/cm$^2$ for the bipolar transistor.

On the basis of these features of power bipolar transistors and MOSFET devices, hybrid devices embodying a combination of bipolar current conduction with gate-controlled current flow were developed and found to provide significant advantages over single technologies employing bipolar junction transistors or MOSFETs alone. Thus, in the insulated gate transistor (IGT), disclosed in an article by coinventor B. J. Baliga, M. S. Adler, R. P. Love, P. V. Gray and N. Zommer, entitled "*The Insulated Gate Transistor: A New Three terminal MOS Controlled Bipolar Power Device,*" IEEE Trans. Electron Devices, ED-31, pp. 821-828 (1984), on-state losses were shown to be greatly reduced when compared to power MOSFETs. This was caused by the conductivity modulation of the IGT's drift region during the on-state. Moreover, very high conduction current densities in the range of 200-300 A/cm$^2$ can also be achieved. Accordingly, an IGT can be expected to have a conduction current density approximately 20 times that of a power MOSFET and five (5) times that of an equivalently sized bipolar transistor. Typical turn-off times for the IGT can be expected to be in the range of 10-50 μs. A cross-sectional representation of a typical insulated gate transistor is shown in FIG. 1.

Although gate-controlled transistors such as the IGT represent an improvement over using bipolar or MOSFET devices alone, even lower conduction losses can be expected by using a thyristor. This is because thyristors offer a higher degree of conductivity modulation and a lower forward voltage drop as compared to the IGT. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased and most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's regeneratively coupled P1-N1-P2 and wide base P1-N2-P2 transistors exceeds unity. An alternative to providing external circuitry or reversing the anode potential to obtain turn-off, however, is to use a MOS-gate or similar device for controlling turn-on and turn-off.

Several methods for obtaining gate control over thyristor action exist. For example, in the MOS-controlled thyristor (MCT), turn-off is provided by shorting the emitter-base junction of the N-P-N transistor to thereby produce a reduction in gain. This form of control ideally raises the holding current of the thyristor to a level above the operating current level. Accordingly, an MCT structure has been reported which utilizes a P-channel MOSFET integrated into the cathode region of a thyristor for turn-off control and an N-channel MOSFET integrated into the P-base region for turn-on control. This device and its complementary counterpart are described in an article by V. A. K. Temple, entitled "*The MOS Controlled Thyristor,*" published in IEDM Technology Digest, Abstract 10.7, pp. 282–285, (1984). FIG. 2 schematically illustrates a prior art MCT and is a reproduction of FIGS. 2 and 3 from the aforesaid Temple article. Although gate-controlled conduction is possible with the MCT, the maximum controllable current density, which is a direct measure of a device's ability to turn-off, is limited by the MOSFET inversion-layer channel resistance and other resistances in the base region. Because of the lower mobility for holes in silicon, MCTs built from n-type high-voltage drift layers exhibit poor current turn-off characteristics. MCTs, such as the one described in U.S. Pat. No. 5,105,244 to Bauer, have also been built to include inverted diodes between the anode and cathode for providing enhanced inductive-load switching characteristics, without the need for an external diode in antiparallel with the MCT.

Other examples of MOS-gated thyristors include the depletion-mode thyristor (DMT), shown in FIG. 3, which overcame many of the drawbacks associated with the MCT. In the DMT, a depletion-mode MOSFET is placed in series with the base of the P-N-P transistor. Accordingly, once the thyristor is turned-on, current flow can be shut off by application of a negative gate bias. This eliminates the base drive by pinching off the base current to the P-N-P transistor and shuts off the device. Also, in U.S. Pat. No. 5,144,401 to Ogura et al., an insulated-gate thyristor is disclosed having two gate electrodes for controlling turn-on and turn-off. The first gate is separately isolated from the first base region and operates a MOSFET between the second emitter region (cathode region) and the first base region. The second gate is laterally disposed with respect to the cathode and electrically contacts the second base region. Both turn-on and turn-off require the sequential control of the two gate electrodes.

Recently, a base resistance controlled thyristor (BRT) was described in U.S. Pat. No. 5,099,300, to inventor B. J. Baliga, and an article entitled "*A New MOS-Gated Power Thyristor Structure with Turn-Off Achieved by Controlling the Base Resistance,*" by M. Nandakumar, inventor B. J. Baliga, M. Shekar, S. Tandon and A. Reisman, IEEE Electron Device Letters, Vol. 12, No. 5, pp. 227–229, May, 1991, both of which are hereby incorporated herein by reference. The BRT operates by modulating the P-base resistance of the thyristor using MOS-gated control. Operational BRTs with 600-volt forward blocking capability, such as the one shown in FIG. 4, have been developed. FIG. 4 is a reproduction of FIG. 1 from the aforesaid Nandakumar, et al. article. The BRT can be turned-off by the application of a negative bias to a P-channel enhancement-mode MOSFET to thereby reduce the resistance of the P-base by shunting majority charge carriers from the P-base to the cathode. As will be understood by one skilled in the art, the reduction in P-base resistance results in an increase in the device's holding current to above the operational current level and shuts-off the device. Like the reported MCT structure, the BRT requires dual-polarity gate control for operation.

It would be preferable to provide a switching device operable with single-polarity gate control and without the limitation associated with the reported MCT. Moreover, it would also be preferable to have a structure capable of being processed with relatively few process steps, using relatively few masks and capable of being highly integrated in a semiconductor substrate.

Some of these preferred features can be found in U.S. Pat. No. 5,014,102, issued to Adler, entitled *Mosfet-Gated Bipolar Transistors and Thyristors with Both Turn-On and Turn-on Capability Having Single-Polarity Gate Input Signal.* This patent discloses a triple-diffused MCT structure with separate enhancement and depletion-mode MOSFETs for providing turn-on and turn-off control, respectively. Turn-off control is provided by a separate termination region in the cathode region and by a P-channel depletion-mode MOSFET between the second base region and the termination region. The termination region is electrically connected to the cathode contact.

Unfortunately, because the termination region is formed by diffusion into the cathode region, the cathode region is large in terms of its lateral dimensions, so that high integration densities may be difficult to achieve. Moreover, the fabrication process described for the Adler MCT requires a relatively costly triple-diffusion fabrication process when compared to the process for forming a BRT, which is basically an IGT baseline process, as reported in the above-referenced article on the BRT. Another consequence of the cathode region being relatively large is the size of the second base region (P-region 174 in Adler) which is correspondingly large because the cathode region is in the second base region. As will be understood by one skilled in the art, the relatively large size of the second base region causes a respective increase in the majority carrier (charge) concentration in the second base when the thyristor is conducting and limits the maximum controllable current density, i.e., the range of on-state current values that can be turned off when a proper gate bias is applied.

A base resistance controlled thyristor (BRT) with single-polarity control and high forward voltage blocking capability is described in copending application entitled A Base Resistance Controlled Thyristor With Single-Polarity and Dual-Polarity Turn-On and Turn-Off Control, Ser. No. 07/919,161, filed Jul. 23, 1992, by inventor B. J. Baliga. This invention includes means for diverting current from the second base region to the cathode via an adjacent region in the substrate. To provide single-polarity control, a "normally-on" channel comprising a doped region in the first base region is provided to shunt majority carriers from the second base region to the cathode, via the adjacent region, and turn-off the thyristor in the absence of a turn-on gate bias.

Notwithstanding the improvements obtained by the invention of the above-noted Baliga application, it would be advantageous to provide a single-polarity controlled thyristor without the need for an adjacent region for shunting current to the cathode. For example, the elimination of the adjacent region for shunting current away from the second base region may provide a substantial reduction in the lateral dimensions of the unit thyristor cell. Higher integration densities may also be produced, resulting in higher total current densities when multiple unit cells are connected in parallel.

SUMMARY OF THE INVENTION

It is therefore an object of the present invention to provide a semiconductor switching device with high input impedance, low on-state voltage drop and single-polarity gate-controlled turn-on and turn-off.

It is another object of the present invention to provide a semiconductor switching device capable of being turned off at high forward current densities and having reduced lateral dimensions suitable for large scale integration in a semiconductor substrate.

These and other objects are provided, according to the present invention, by a semiconductor switching device comprising a thyristor and a gate controlled transistor for turning the thyristor off. The gate controlled transistor also prevents the initiation of inadvertent forward conduction and latch-up when spurious noise signals occur across the device. An insulating region, such as a buried dielectric layer, is provided to insulate the transistor from the second base region of the thyristor and force the turn-off current to flow through the transistor in response to the removal of a turn-on bias signal.

In particular, the semiconductor switching device according to the present invention comprises a thyristor having an anode region, a first base region of first conductivity type on the anode region, a second base region of second conductivity type on the first base region and a cathode region of first conductivity type contacting the second base region and forming a P-N junction therewith. Preferably, turn-off of the thyristor is provided by transistor means between the second base region and the cathode contact. The transistor means, which is preferably a depletion-mode MOSFET, provides a direct and highly conductive path ("short") between the second base region and the cathode contact when a zero or near zero bias is applied to the MOSFET's gate electrode. The highly conductive path effectively shorts the uppermost P-N junction of the thyristor, between the cathode region and second base region, along its entire length, and either turns the thyristor off or holds the thyristor in a nonconducting state.

Insulating means is also provided between the transistor means, such as the depletion-mode MOSFET, and the second base region. The insulating means precludes direct conduction between the second base region and the cathode contact except via the transistor means. The insulating means is preferably an insulating region, such as a dielectric selected from the group consisting of SiO2, Si3N4, Al2O3 and MgAl2O4, but may also comprise other electric insulating materials compatible with semiconductor device processing. Well known processes for forming the insulating region, such as SIMOX, may be used. Alternatively, if the insulating region is formed on the surface of the semiconductor substrate, process techniques such as epitaxial lateral overgrowth (ELO) can be used to form semiconducting regions for the transistor means on the insulating region.

Finally, turn-on of the thyristor is provided by turn-on gating means in the second base region, between the cathode region and the first base region. The turn-on gating means preferably comprises an enhancement-mode MOSFET for electrically connecting the first base region to the cathode region and provides base drive current to the coupled P-N-P and N-P-N transistors when a turn-on bias signal is applied. For example, if the second base region is of P-type conductivity, a positive bias signal to the turn-on gating means produces a conductive inversion channel in the second base region and turns on the device when the anode of the thyristor is biased positive with respect to the cathode.

Accordingly, rather than having a transistor outside and adjacent the second base region or laterally disposed in the cathode region, it can be placed on the second base region, with an insulating region therebetween. A significant reduction in the lateral dimensions of the unit cell for the semiconductor switching device of the present invention can thereby be obtained. Moreover, because of the reduced dimensions obtainable with this invention, higher total forward current densities can be provided when multiple cells are connected in parallel for high power applications.

DESCRIPTION OF PREFERRED EMBODIMENTS

The present invention will now be described more fully hereinafter with reference to the accompanying drawings, in which preferred embodiments of the invention are shown. This invention may, however, be embodied in different forms including a complementary structure and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
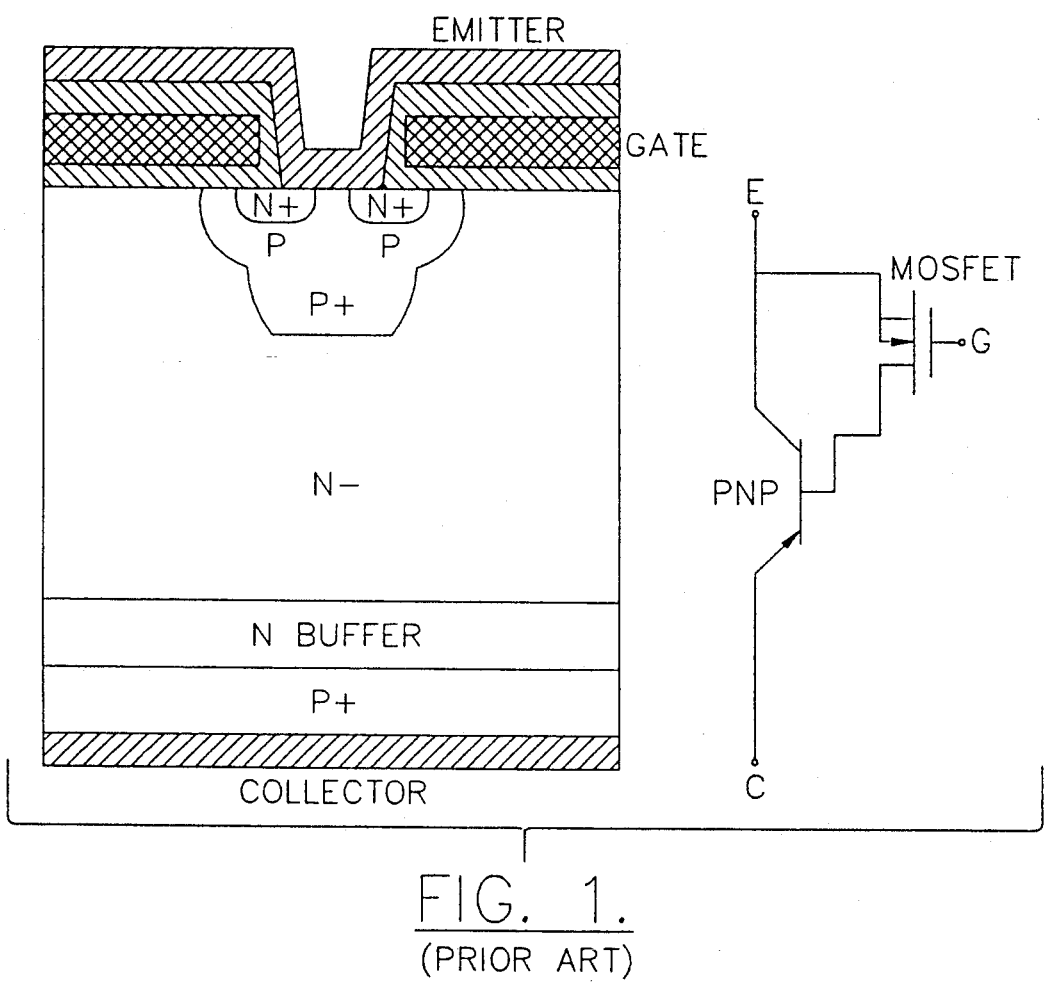
FIG. 1 illustrates a cross-sectional representation of a prior art insulated gate transistor (IGT).
Figure 2:
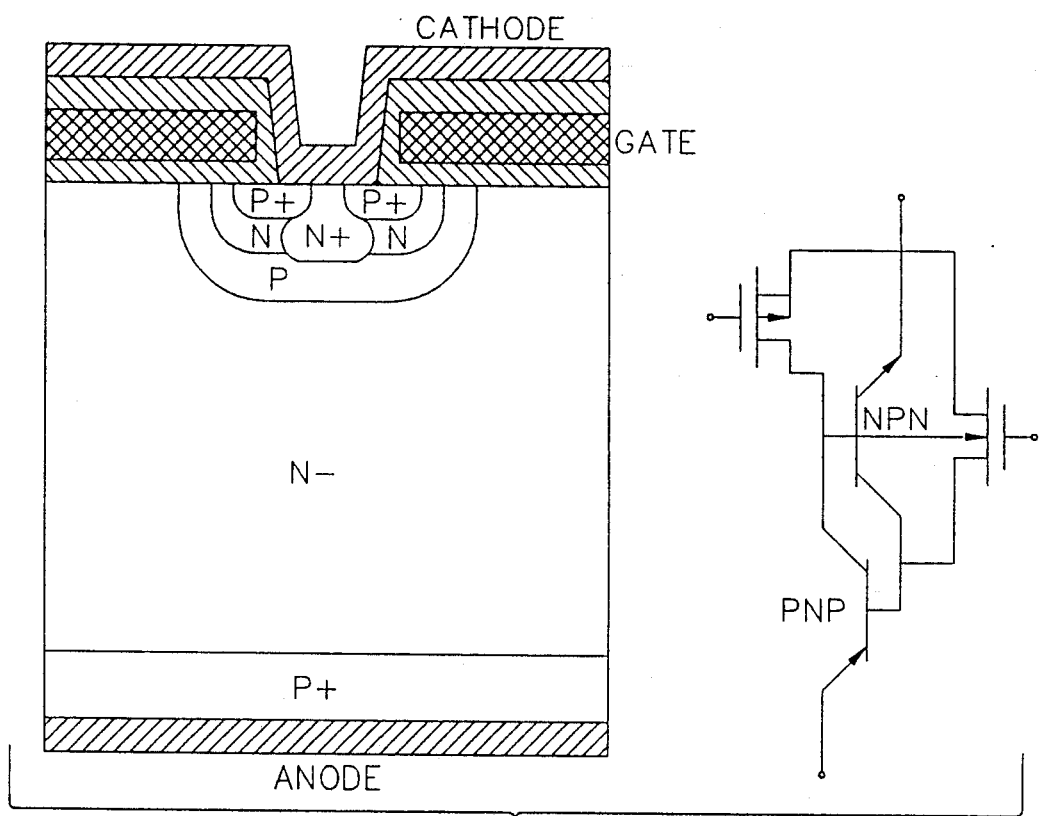
FIG. 2 illustrates a cross-sectional representation of a prior art MOS-controlled thyristor (MCT).
Figure 3:
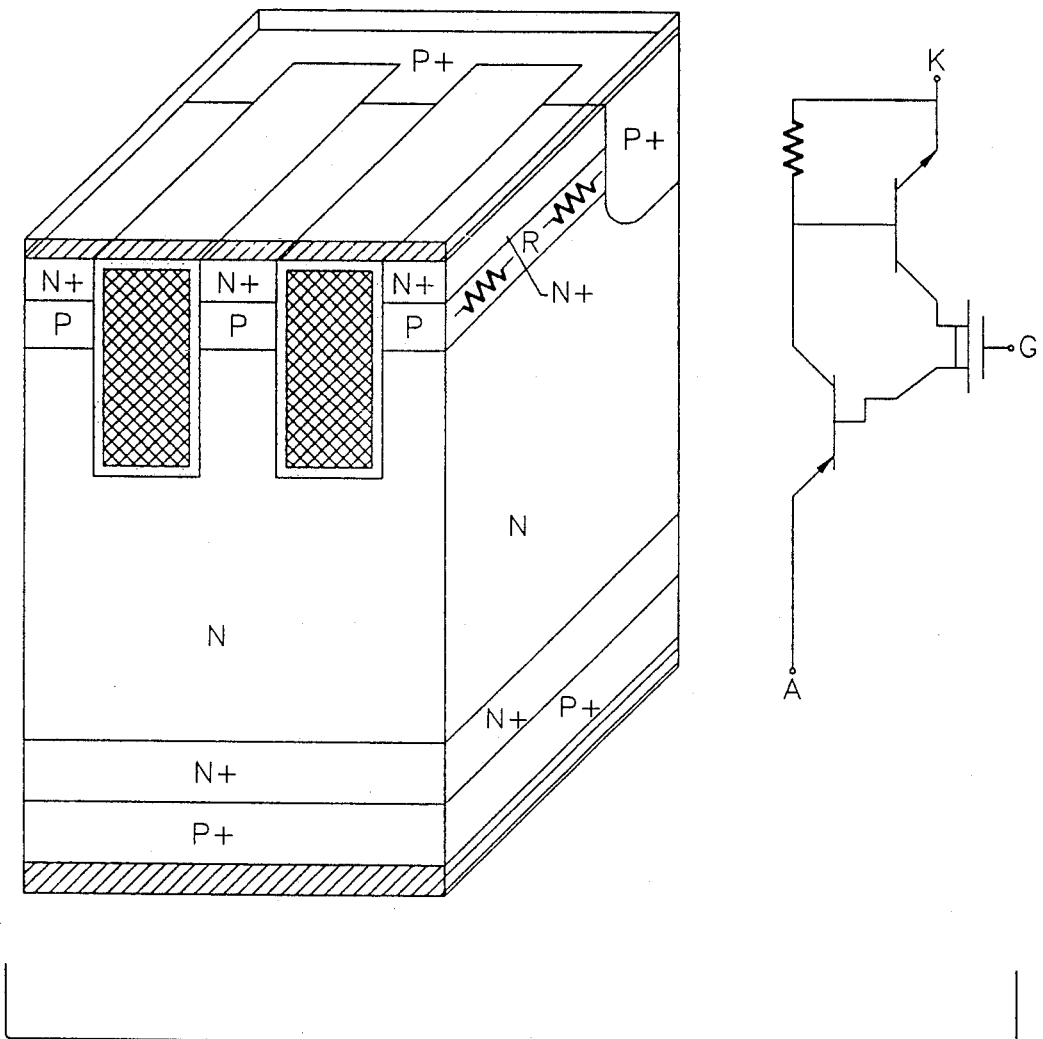
FIG. 3 illustrates a cross-sectional representation of a prior art depletion-mode thyristor (DMT).
Figure 4:
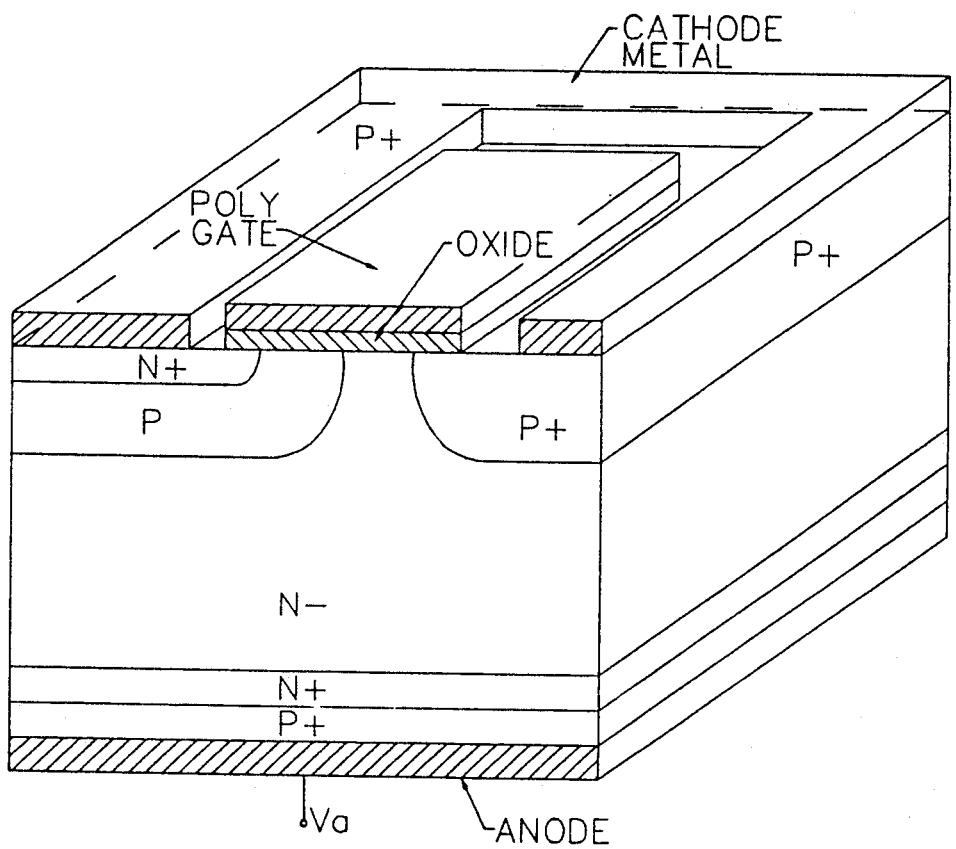
FIG. 4 illustrates a three-dimensional cross-sectional representation of a prior art base resistance controlled thyristor (BRT).
Figure 5:
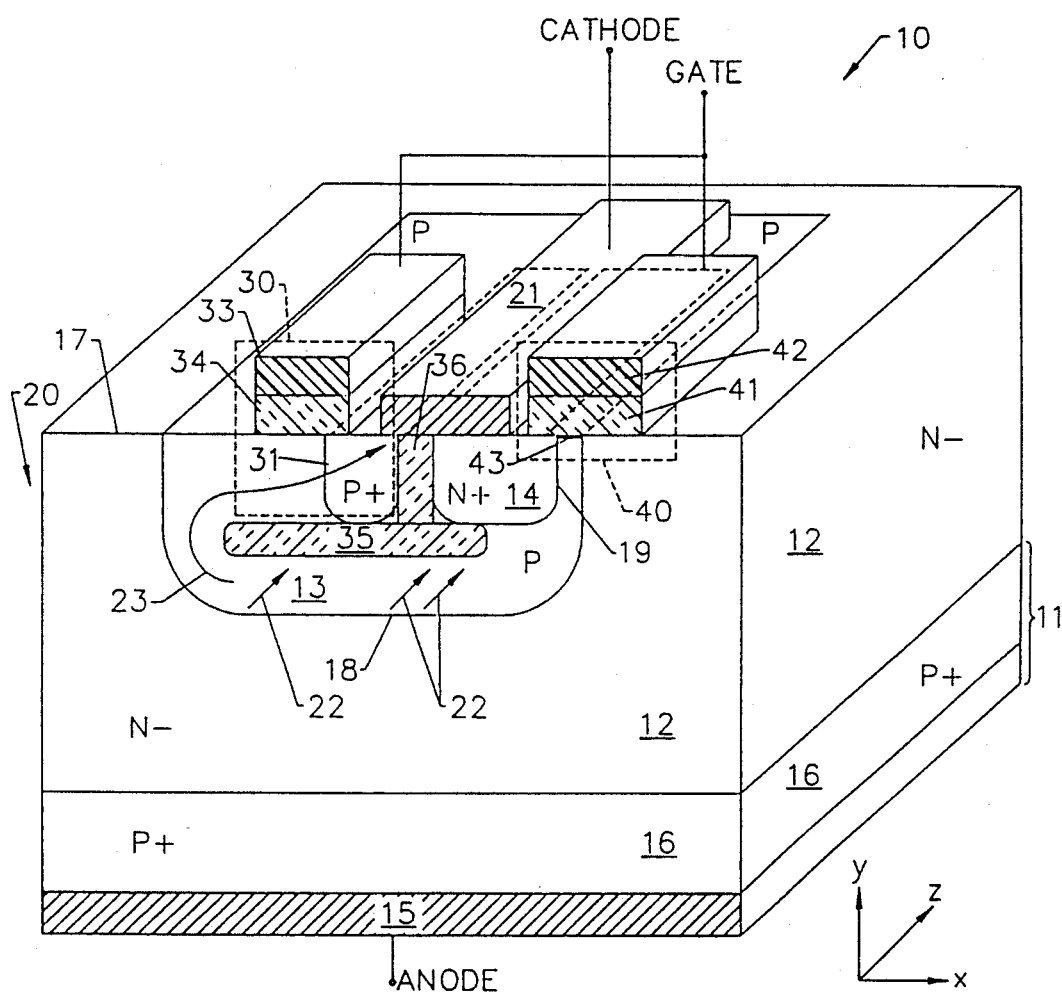
FIG. 5 illustrates a two-dimensional cross-sectional representation of a semiconductor switching device according to the present invention.

Referring now to FIG. 5, a semiconductor switching device 10 according to the present invention will be described. The semiconductor switching device 10 includes a thyristor comprised of four semiconductor regions 11-14 in a semiconductor substrate 20. The anode region 11 preferably comprises a metallized anode contact 15 at one face of the substrate 20 and a highly doped region 16 of second conductivity type in the substrate 20. A first base region 12 of first conductivity type is on the anode region 11 and extends to opposite face 17 of the substrate 20. A second base region 13 of second conductivity type, extending to the face 17, is also provided on the first base region 12, and defines a P-N junction 18 therewith.

The thyristor further comprises a cathode region 14 of first conductivity type in the substrate 20. The cathode region 14 contacts the second base region 13 and forms a P-N junction 19 therewith. In addition, electrical contact to the cathode region 14 is made by a cathode contact 21 at the face 17.

As will be understood by one skilled in the art, forward conduction in the thyristor can be sustained by the application of a positive bias, with respect to the cathode contact 21, to the anode contact 15 for the P-N-P-N structure, as shown. In addition, rather than traversing the P-N junction 19, majority charge carriers in the second base region 13 can flow underneath the cathode region 14 (emitter) and indirectly to the cathode contact 21 in the z-direction, as shown by arrows 22. Schematically, this indirect path to the cathode contact 21 can be considered as a base resistance $R_B$ between the second base region 13 and the cathode contact 21. Schematically, the base resistance $R_B$ is in parallel with the uppermost P-N junction 19 of the thyristor.

Still referring to FIG. 5, turn-off of the thyristor is provided by transistor means 30 for electrically connecting the cathode contact 21 to the second base region 13, preferably in response to a zero or near zero bias signal being applied to gate 33. The electrical connection provided by transistor means 30 shunts majority carriers in the second base region 13 to the cathode contact 21 along the direction shown by arrow 23. The transistor means 30 preferably comprises a second conductivity type depletion-mode field effect transistor, such as a MOSFET with a gate oxide 34 on the face 17 and a gate 33 thereon.

An insulating region 35 is provided between the second base region 13 and transistor means 30. Because of the presence of the insulating region 35 in the substrate 20, the conductivity of the regions defined by the transistor means 30 can be controlled by the application of a bias signal to gate 33. For example, by applying a zero or near zero bias signal to the gate 33, the direct electrical connection ("short") between the second base region 13 and the cathode contact 21 can be maintained, thereby shunting majority carriers to the cathode contact 21 in order to turn off the device or hold the device in a nonconducting state. Alternatively, by applying an appropriate polarity bias signal to gate 33 (positive for the device as shown), the electrical connection shown by arrow 23 can be eliminated, thereby forcing the majority carriers across the P-N junction 19 or in the direction 22. As will be understood by one skilled in the art, the electrical connection, shown by arrow 23, is eliminated because the P-type region between the insulating region 35 and the face 17 is depleted of mobile charge carriers when the gate 33 is biased positive.

In a preferred embodiment, a diverter region 31, comprising a relatively highly doped region of second conductivity type, is provided in the substrate 20 and on the insulating region 35. The diverter region 31 also electrically contacts the cathode contact 21 and is adjacent the cathode region 14. As shown in FIG. 5, the diverter region 31 comprises the source of the second conductivity type channel depletion-mode MOSFET. Preferably, an insulating region 36 is also provided between the diverter region 31 and the cathode region 14 to prevent the potential formation of a conducting P-N junction therebetween. As will be understood by one skilled in the art, the second conductivity type channel depletion-mode MOSFET can be replaced with a second conductivity type channel enhancement-mode MOSFET. However, if the second conductivity type channel is P-type, a negative bias would be required to create a P-type inversion layer channel and electrically connect the cathode contact 21 to the second base region 13, along the direction shown by arrow 23, and turn-off the device or hold the device in a nonconducting state.

The insulating region 35 is preferably a dielectric selected from the group consisting of $SiO_2$, $Si_3N_4$, $Al_2O_3$ and $MgAl_2O_4$, but may also be using other electrical insulating materials compatible with semiconductor device processing. In terms of device processing, conventional separation by implanted oxygen (SIMOX) technologies can be used to form a buried insulating region 35. Alternatively, if the insulating region 35 is formed on face 17, transistor means 30 can be provided on the insulating region 35 using conventional processing techniques such as epitaxial lateral overgrowth (ELO). Conventional techniques can also be used to form the insulating region 36.

Turn-on of the thyristor is also preferably provided by turn-on gating means 40 in the second base region 13. For example, turn-on gating means 40 comprising a first conductivity type channel enhancement-mode field effect transistor can be provided for electrically connecting the cathode region 14 to the first base region 12, to thereby supply majority carriers to the first base region 12 when the anode contact 15 is biased positive with respect to the cathode contact 21. As shown, an enhancement-mode MOSFET is provided having a gate oxide 41 and gate 42 at face 17. Accordingly, depending on the conductivity type of the second base region, (P-type, N-type) the application of a non-zero bias signal (positive, negative) to gate 42 can be used to create a conductive inversion layer 43 in the substrate 20 and initiate turn-on. For single-polarity turn-on and turn-off control, the gates 33 and 42 can be electrically connected and a second conductivity type channel depletion-mode MOSFET can be used as transistor means 30.

Figure 6:
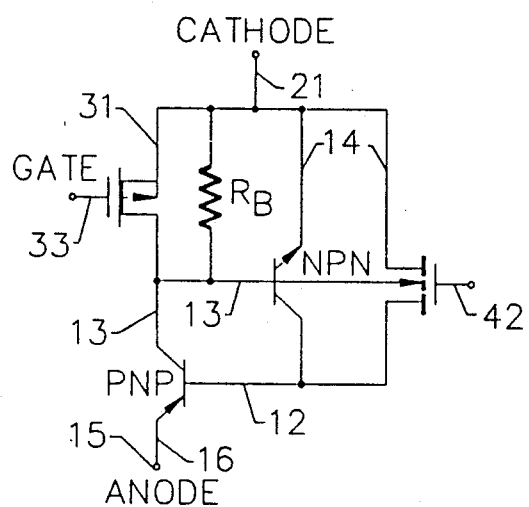
FIG. 6 illustrates an electrical schematic of the semiconductor switching device of FIG. 5.

Referring now to FIG. 6, an electrical schematic of the semiconductor switching device of FIG. 5 is provided. The numerals indicating the electrical connections correspond to the respective regions shown in FIG. 5. As will be understood by one skilled in the art, the turn-on gating means is schematically shown by the enhancement-mode NMOS transistor connected between source and drain terminals 14 and 12, respectively, and gate terminal 42. The coupled P-N-P and N-P-N bipolar transistor portions of the thyristor respectively correspond to regions: (16, 12, 13) and (12, 13, 14). In addition, the transistor means 30 is shown schematically by the depletion-mode PMOS transistor, having gate electrode 33. Finally, the resistance between the second base region 13 and the cathode contact 21 is shown schematically as $R_B$.

Accordingly, a semiconductor switching device according to the present invention comprises a thyristor having an integrated single-polarity turn-off control in the semiconductor substrate. In the preferred embodiment, turn-off is provided by transistor means. In particular, the transistor means comprises a depletion-mode field effect transistor having a source (diverter region) electrically insulated from the second base region by an insulating region. Accordingly, when a zero gate bias (turn-off bias signal) is applied to the depletion-mode transistor, a highly conductive electrical path ("short") is provided between the second base region and the cathode contact. However, when a positive bias is applied to the P-channel depletion-mode transistor, the direct electrical connection between the second base region and cathode contact is eliminated, thus making turn-on of the thyristor possible when the turn-on gating means in enabled. Because the transistor means provides a conductive path for shunting majority carriers to the cathode contact at zero or near zero bias and provides a non-conductive path when a proper polarity turn-on bias is applied, single-polarity turn-on and turn-off control is achieved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   a thyristor having an anode region, a first base region of first conductivity type on said anode region, a second base region of second conductivity type on said first base region, and a cathode region of first conductivity type contacting said second base region and defining a P-N junction therebetween;
   a cathode contact electrically connected to said cathode region;
   an electrical insulating region on said second base region; and
   transistor means on said insulating region, opposite said second base region, for providing a direct electrical path between said cathode contact and said second base region in response to a turn-off bias signal.

2. The semiconductor switching device of claim 1, wherein said electrical insulating region is selected from the group consisting of $SiO_2$, $Si_3N_4$, $Al_2O_3$ and $MgAl_2O_4$.

3. The semiconductor switching device of claim 1, wherein said transistor means comprises a second conductivity type channel depletion-mode field effect transistor extending from said cathode contact onto said insulating region and to said second base region, said depletion-mode transistor having a first gate electrode for receiving said turn-off bias signal.

4. The semiconductor switching device of claim 3, wherein said second base region is a relatively lightly doped region of second conductivity type, and wherein the source of said depletion-mode field effect transistor comprises a relatively highly doped region of second conductivity type on said insulting region, said relatively highly doped region being adjacent said cathode region and electrically connected to said cathode contact.

5. The semiconductor switching device of claim 3, further comprising turn-on gating means in said second base region for electrically connecting said cathode region and said first base region in response to a turn-on bias signal.

6. The semiconductor switching device of claim 5, wherein said turn-on gating means comprises a first conductivity type channel enhancement-mode field effect transistor having a second gate electrode for receiving said turn-on bias signal, and wherein said first gate electrode of said depletion-mode transistor and said second gate electrode of said enhancement-mode transistor are electrically connected.

7. A semiconductor switching device comprising:
   a semiconductor substrate;
   a thyristor in said substrate, said thyristor having an anode region, a first base region of first conductivity type on said anode region and extending to a face of said substrate, a second base region of second conductivity type on said first base region, said first and second base regions defining a first P-N junction therebetween, and a cathode region of first conductivity type contacting said second base region and defining a second P-N junction therebetween;
   a cathode contact on the face, electrically connected to said cathode region;
   a buried dielectric layer on said second base region, between the face of said substrate and the junction of said first base region and said second base region;
   a diverter region of second conductivity type on said buried dielectric layer and adjacent said cathode region, electrically connected to said cathode contact; and
   a second conductivity type channel depletion-mode field effect transistor extending from said diverter region onto said buried dielectric layer and to said second base region, said depletion-mode transistor having a first gate electrode.

8. The semiconductor switching device of claim 7, wherein said buried dielectric layer is selected from the group consisting of $SiO_2$, $Si_3N_4$, $Al_2O_3$ and $MgAl_2O_4$.

9. The semiconductor switching device of claim 7, further comprising turn-on gating means in said second base region for electrically connecting said cathode region and said first base region in response to a turn-on bias signal.

10. The semiconductor switching device of claim 9, wherein said turn-on gating means comprises a first conductivity type channel enhancement-mode field effect transistor having a second gate electrode, and wherein said first gate electrode of said depletion-mode transistor and said second gate electrode of said enhancement-mode transistor are electrically connected.

11. A semiconductor switching device comprising:
    a semiconductor substrate;
    a thyristor in said substrate, said thyristor having an anode region, a first base region of first conductivity type on said anode region, a second base region of second conductivity type on said first base region and extending to a face of said substrate;
    a cathode region of first conductivity type, in said substrate, contacting said second base region to thereby define a P-N junction;
    a cathode contact on the face, electrically connected to said cathode region;
    a diverter region of second conductivity type in said substrate, electrically connected to said cathode contact;
    insulating means on said second base region for electrically insulating said diverter region from said second base region; and
    transistor means in said substrate for providing a direct electrical connection between said second base region and said diverter region, in response to a turn-off bias signal.

12. The semiconductor switching device of claim 11, wherein said insulating means comprises a dielectric region on said second base region and said transistor means comprises a second conductivity type channel depletion-mode field effect transistor on the dielectric region, electrically connected between said diverter region and said second base region.

13. The semiconductor switching device of claim 12, wherein said dielectric region is selected from the group consisting of $SiO_2$, $Si_3N_4$, $Al_2O_3$ and $MgAl_2O_4$.

14. A base-resistance controlled thyristor comprising:
a semiconductor substrate;
an anode region in said substrate;
a first base region of first conductivity type on said anode region and extending to a face of said substrate;
a second base region of second conductivity type on said first base region and extending to the face;
an insulating region on said second base region;
a cathode region of first conductivity type on said insulating region and contacting said second base region, said cathode region and said second base region defining a P-N junction therebetween;
a cathode contact at the face, electrically connected to said cathode region; and
transistor means on said insulating region for electrically connecting said cathode contact to said second base region in response to a turn-off bias signal.

15. The base-resistance controlled thyristor of claim 14, wherein said transistor means comprises a field effect transistor extending from said cathode contact onto said insulating region and to said second base region.

16. The base-resistance controlled thyristor of claim 15, wherein said insulating region is selected from the group consisting of $SiO_2$, $Si_3N_4$, $Al_2O_3$ and $MgAl_2O_4$.

17. The base-resistance controlled thyristor of claim 15, wherein said field effect transistor comprises a second conductivity type channel depletion-mode MOSFET.

18. The base-resistance controlled thyristor of claim 15, further comprising turn-on gating means in said second base region for electrically connecting said cathode region and said first base region in response to a turn-on bias signal.

19. The base-resistance controlled thyristor of claim 18, wherein said turn-on gating means comprises a first conductivity type channel enhancement-mode field effect transistor.

* * * * *

UNITED STATES PATENT AND TRADEMARK OFFICE
CERTIFICATE OF CORRECTION

PATENT NO. : 5,241,194
DATED : August 31, 1993
INVENTOR(S) : Baliga

It is certified that error appears in the above-identified patent and that said Letters Patent is hereby corrected as shown below:

On the title page:
UNDER "REFERENCES CITED":

Item (22): should be -- No. 2 --

IN THE SPECIFICATION:

In column 1, line 62, "gate." should be -- gate, --

In column 4, line 18, "Turn-on" should be -- Turn-Off"

In column 8, line 7, after "be" insert -- formed --

Signed and Sealed this

Fifteenth Day of March, 1994

Attest:

BRUCE LEHMAN

*Attesting Officer*   Commissioner of Patents and Trademarks